(12) United States Patent
Hong et al.

(10) Patent No.: US 12,446,356 B2
(45) Date of Patent: Oct. 14, 2025

(54) DISPLAY TRANSFER STRUCTURE AND METHOD OF MANUFACTURING THE SAME

(71) Applicant: SAMSUNG ELECTRONICS CO., LTD., Suwon-si (KR)

(72) Inventors: Seogwoo Hong, Yongin-si (KR); Hyunjoon Kim, Seoul (KR); Joonyong Park, Suwon-si (KR); Kyungwook Hwang, Suwon-si (KR); Junsik Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 488 days.

(21) Appl. No.: 17/479,706

(22) Filed: Sep. 20, 2021

(65) Prior Publication Data

US 2022/0190193 A1 Jun. 16, 2022

Related U.S. Application Data

(60) Provisional application No. 63/125,593, filed on Dec. 15, 2020.

(30) Foreign Application Priority Data

Apr. 1, 2021 (KR) .................. 10-2021-0042808

(51) Int. Cl.
*H10H 20/01* (2025.01)
*H01L 21/683* (2006.01)
*H01L 25/075* (2006.01)

(52) U.S. Cl.
CPC ......... *H10H 20/01* (2025.01); *H01L 21/6835* (2013.01); *H01L 25/0753* (2013.01);
(Continued)

(58) Field of Classification Search
CPC ....... H01L 21/6835; H01L 2221/68309; H01L 2221/68313; H01L 2221/68354;
(Continued)

(56) References Cited

U.S. PATENT DOCUMENTS 6,590,346 B1 * 7/2003 Hadley ............... H01L 23/5389
257/E21.705
6,844,673 B1 1/2005 Bernkopf
(Continued)

FOREIGN PATENT DOCUMENTS

EP 3352211 A1 7/2018
JP 4613489 B2 1/2011
(Continued)

OTHER PUBLICATIONS

Communication dated Jun. 12, 2024, issued by the Korean Patent Office in Korean Application No. 10-2021-0042808.

*Primary Examiner* — Matthew C Landau
*Assistant Examiner* — Dmitriy Yemelyanov
(74) *Attorney, Agent, or Firm* — Sughrue Mion, PLLC

(57) ABSTRACT

A display transfer structure includes a base layer, a flexible barrier rib positioned on the base layer and having a plurality of holes therein, and a plurality of micro light emitting diodes (LEDs) positioned respectively in the plurality of holes. A method of manufacturing the display transfer structure includes forming a flexible barrier rib having holes on a base layer, supplying liquid to the holes, supplying micro LEDs to the liquid, and scanning the flexible barrier rib with an absorber capable of absorbing the liquid to align each of the micro LEDs in a respective hole such that electrodes of the micro LEDs face an outside of the holes.

12 Claims, 23 Drawing Sheets

(52) U.S. Cl.
CPC .. *H01L 2221/68309* (2013.01); *H10H 20/032* (2025.01); *H10H 20/0361* (2025.01)

(58) Field of Classification Search
CPC ............... H01L 25/0753; H01L 25/167; H01L 2933/0016; H01L 2933/0041; H01L 33/005; H01L 33/0095; H01L 33/50
See application file for complete search history.

(56) References Cited

U.S. PATENT DOCUMENTS

| | | | |
|---|---|---|---|
| 9,240,145 B2 | 1/2016 | Ichioka et al. | |
| 9,825,202 B2 | 11/2017 | Schuele et al. | |
| 10,115,862 B2 | 10/2018 | Zhan et al. | |
| 10,211,364 B2 | 2/2019 | Schuele et al. | |
| 10,243,097 B2 | 3/2019 | Yuen | |
| 10,418,527 B2 | 9/2019 | Sasaki et al. | |
| 10,475,958 B2 | 11/2019 | Zhan et al. | |
| 10,749,083 B2 | 8/2020 | Sasaki et al. | |
| 10,768,515 B2 * | 9/2020 | Choy | G03B 21/28 |
| 2013/0009183 A1 * | 1/2013 | Han | H10H 20/856 257/E33.059 |
| 2018/0012873 A1 | 1/2018 | Lee et al. | |
| 2019/0181304 A1 | 6/2019 | Sasaki et al. | |
| 2019/0326477 A1 * | 10/2019 | Kim | H01L 33/20 |
| 2020/0152826 A1 | 5/2020 | Lee et al. | |
| 2021/0090929 A1 * | 3/2021 | Yang | H01L 21/67144 |
| 2021/0091257 A1 | 3/2021 | Hwang et al. | |
| 2021/0119079 A1 | 4/2021 | Hwang et al. | |
| 2021/0225815 A1 | 7/2021 | Bower et al. | |
| 2021/0313305 A1 | 10/2021 | Bibl et al. | |
| 2021/0397045 A1 | 12/2021 | Hwang et al. | |
| 2022/0013400 A1 | 1/2022 | Hwang et al. | |
| 2022/0102602 A1 | 3/2022 | Hwang et al. | |
| 2022/0230997 A1 | 7/2022 | Choi | |
| 2023/0061671 A1 | 3/2023 | Yang et al. | |
| 2023/0110862 A1 * | 4/2023 | Kim | H01L 33/38 257/91 |

FOREIGN PATENT DOCUMENTS

| | | | |
|---|---|---|---|
| JP | 2016522585 A | | 7/2016 |
| JP | 201924108 A | | 2/2019 |
| KR | 1020190061464 A | | 6/2019 |
| KR | 10-2019-0076929 A | | 7/2019 |
| KR | 10-2020-0014866 A | | 2/2020 |
| KR | 20200026714 A | * | 3/2020 |
| KR | 20200026845 A | * | 3/2020 |
| KR | 1020200023319 A | | 3/2020 |
| KR | 10-2021-0157093 A | | 12/2021 |
| KR | 10-2022-0007500 A | | 1/2022 |
| KR | 10-2022-0013739 A | | 2/2022 |
| KR | 10-2022-0041484 A | | 4/2022 |

* cited by examiner

DISPLAY TRANSFER STRUCTURE AND METHOD OF MANUFACTURING THE SAME

CROSS-REFERENCE TO RELATED APPLICATIONS

This application is based on and claims priority under 35 U.S.C. § 119 to U.S. Provisional Application No. 63/125,593, filed on Dec. 15, 2020, in the US Patent and Trademark Office and Korean Patent Application No. 10-2021-0042808, filed on Apr. 1, 2021, in the Korean Intellectual Property Office, the disclosures of which are incorporated by reference herein in their entireties.

BACKGROUND

1. Field

Embodiments relate to a display transfer structure and a method of manufacturing the same.

2. Description of the Related Art

Display devices include display panels such as organic light emitting display panels or liquid crystal display panels. Light emitting diodes may be included as a light emitting display panel among the display panels, and for example, in terms of micro light emitting diodes (LEDs), there are organic light emitting diodes (OLEDs) using organic materials as a fluorescent material, and inorganic light emitting diodes using inorganic materials as a fluorescent material.

The inorganic light emitting diodes using inorganic semiconductors as a fluorescent material are beneficial in that the diodes are durable even in a high temperature setting, and have a greater blue light efficiency than the organic light emitting diodes.

Such LEDs may be transferred through a laser lift off (LLO) method or a pick and place method, and used for manufacturing displays. However, when these methods are used, micro LEDs 130 become smaller, and displays become larger in size, resulting in reduced productivity.

SUMMARY

Provided are a display transfer structure which may be manufactured in a large area and a method of manufacturing the same.

Additional aspects will be set forth in part in the description which follows and, in part, will be apparent from the description, or may be learned by practice of example embodiments of the disclosure.

In accordance with an aspect of the disclosure, a display transfer structure includes a base layer; a flexible barrier rib positioned on the base layer, the flexible barrier rib having a plurality of holes; and a plurality of micro light emitting diodes (LEDs) respectively positioned in the plurality of holes, wherein each of the plurality of micro LEDs includes a surface facing an outside of the plurality of holes, and wherein for each of the plurality of micro LEDs, at least one electrode is positioned on the surface.

An upper surface of the flexible barrier rib may be more hydrophobic than a surface of the base layer exposed by the plurality of holes.

Each of the plurality of holes may have a cross-section larger than a cross-section of the respective micro LED, and smaller than twice the cross-section of the respective micro LED.

The flexible barrier rib may have a depth that is 0.8 times to 1.5 times a largest thickness of the plurality of micro LEDs.

The base layer may include a first material and the flexible barrier rib comprises a second material different from the first material.

The flexible barrier rib may include a polymer material.

The polymer material may include a photosensitive material.

The flexible barrier rib may include a polymer layer positioned on the base layer; and a metal layer positioned on the polymer layer.

The polymer layer may include at least one from among an acrylic-based polymer, a silicone-based polymer, and an epoxy-based polymer.

The metal layer may include at least one from among Ag, Au, Pt, Ni, Cr, and Al.

The base layer may include a substrate; and a flexible film between the substrate and the flexible barrier rib.

The flexible film may include at least one of polyimide (PI), polycarbonate (PC), polyethylene terephthalate (PET), tri-acetyl cellulose (TAC), and covalent organic polymer (COP).

The plurality of holes may include a plurality of first holes arranged at a first interval and a plurality of second holes arranged at a second interval, the second interval being different from the first interval.

The plurality of first holes may be positioned in a central region of the display transfer structure, and the plurality of second holes may be positioned in an edge region of the display transfer structure.

The base layer may include a driving layer including a plurality of thin film transistors (TFTs) electrically and respectively connected to the plurality of micro LEDs.

The display transfer structure may further include a plurality of electrode patterns, wherein each of the plurality of micro LEDs is connected with at least one respective TFT of the plurality of TFTs by at least one from among the plurality of electrode patterns; and an insulating layer filling the plurality of holes.

At least one from among the plurality of electrode patterns may be connected to the at least one respective TFT via at least one through hole formed in the flexible barrier rib.

The display transfer structure may further include a color conversion layer positioned on the plurality of micro LEDs, the color conversion layer converting a color of light emitted from at least one from among the plurality of micro LEDs.

In accordance with an aspect of the disclosure, a method of manufacturing a display transfer structure includes forming, on a base layer, a flexible barrier rib having a plurality of holes; supplying liquid to the plurality of holes; supplying a plurality of micro light emitting diodes (LEDs) to the liquid; and scanning the flexible barrier rib with an absorber capable of absorbing the liquid to align each of the plurality of micro LEDs in a respective hole of the plurality of holes such that electrodes of the plurality of micro LEDs face an outside of the plurality of holes.

The forming of the flexible barrier rib may include forming a photosensitive polymer layer on the base layer; and providing light to the photosensitive polymer layer to form the plurality of holes.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
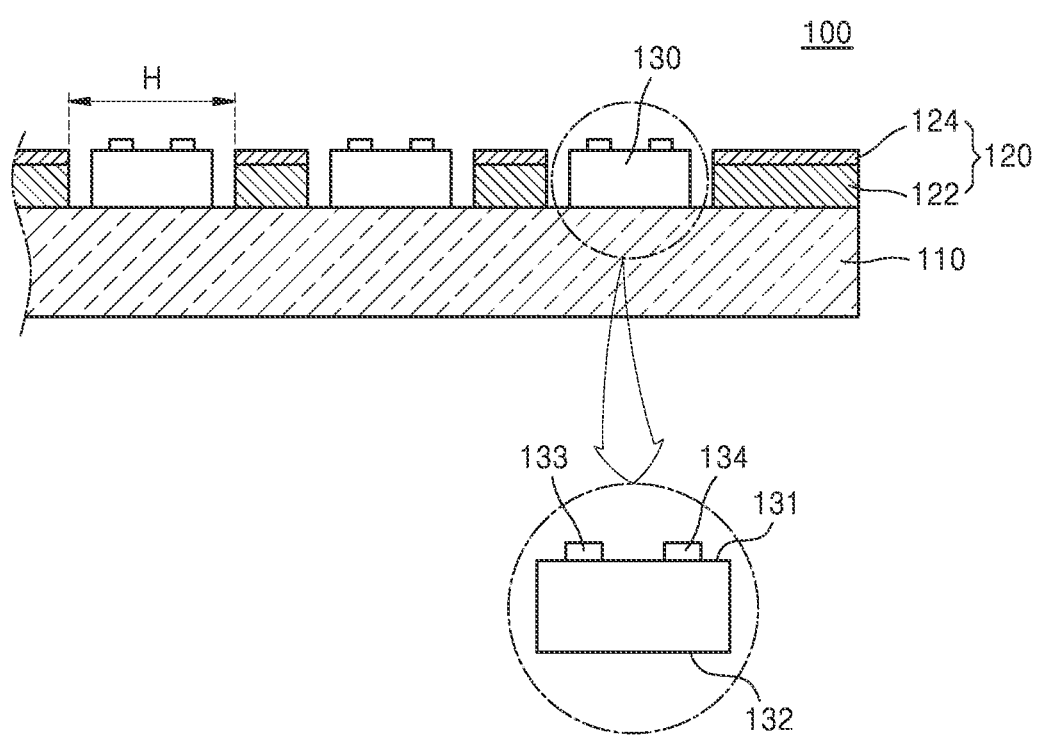
FIG. 1 is a view showing a display transfer structure according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Embodiments described herein are merely examples and can be embodied in various forms. Like reference numerals in the drawings below denote like elements, and the sizes of elements may be exaggerated for clarity and convenience of description.

Hereinafter, an expression "above" or "on" may include not only directly on in a contact manner but also on in a non-contact manner.

It will be understood that, although the terms first, second, etc., may be used herein to describe various elements, these terms are only used to distinguish one element from another element. These terms do not limit elements to having different materials or structures.

The singular forms include the plural forms as well, unless the context clearly indicates otherwise. In addition, when an element "includes" a component, it may indicate that the element does not exclude another component unless explicitly described to the contrary, but can further include another component.

The use of the term "the" and similar referents may be construed to cover both the singular and the plural.

Operations of a method may be performed in any appropriate order unless explicitly described in terms of order or described to the contrary. In addition, examples or example terms (for example, "such as" and "etc.") are used for the purpose of description and are not intended to limit the scope of the disclosure unless defined by the claims.

FIG. 1 is a view showing a display transfer structure 100 according to an embodiment. Referring to FIG. 1, the display transfer structure 100 may include a base layer 110, a flexible barrier rib 120 positioned on the base layer 110 and having a plurality of holes H formed therein, and a plurality of micro light emitting diodes (LEDs) 130 positioned respectively in the plurality of holes H.

The base layer 110 may include organic materials and inorganic materials, such as silicon, glass, sapphire, and a polymer. The base layer 110 may be formed as a single layer or a plurality of layers.

The flexible barrier rib 120 may include a plurality of holes H. The holes H may guide transfer of the micro LEDs 130 when the micro LEDs 130 are transferred onto the base layer 110. The holes H may be manufactured through patterning using photolithography, etching, or molding, but are not limited thereto.

The holes H may have a larger cross-section area than the micro LEDs 130 to respectively accommodate the micro LEDs 130 therein. The holes H may have a cross-section larger than a cross-section of the micro LEDs 130, and smaller than twice a cross-section of the micro LEDs 130. Accordingly, each micro LED 130 may be positioned in one hole H. The holes H may have a shape similar to a cross-section of the micro LEDs 130, for example, a circular cross-section or a polygonal cross-section.

The depth of the holes H may be similar to the largest thickness of the micro LEDs 130. For example, the holes H may have a depth that is 0.8 times to 1.5 times the largest thickness of the micro LEDs 130. Meanwhile, the bottom surface of the holes H may have a roughness of 50 nm or less.

The upper surface of the flexible barrier rib 120 may be more hydrophobic than the surface of the base layer 110 exposed by the holes H. Thus, electrodes of the micro LEDs 130 may be aligned in the holes H in a certain direction, that is, facing the outside of the holes H.

The flexible barrier rib 120 may include a polymer layer 122 positioned on the base layer 110 and a metal layer 124 positioned on the polymer layer 122. The polymer layer 122 may be a photosensitive polymer. The polymer layer 122 may include at least one of an acrylic-based polymer, a silicone-based polymer, and an epoxy-based polymer. A polymer layer 122 including a photosensitive resin may be patterned through photolithography, and a polymer layer 122 that does not include a photosensitive resin may be patterned through etching and molding.

The polymer layer 122 is a flexible material, and thus, the flexible barrier rib 120 may be restored to an original state thereof even when slight pressure is applied to the flexible barrier rib 120 to align the micro LEDs 130 respectively in the holes H. In addition, the polymer layer 122 may be formed at a regular thickness over a large area through a coating process, and due to the fact that the metal layer 124 is also used in a general display process, a flexible large-area display transfer structure 100 may be formed. Using a large-area film transfer method (e.g., a transfer method using a difference in adhesive strength of a sacrificial layer, a laser lift-off method using a functional film, or a transfer method using a UV lift off method), the micro LEDs 130 included in the display transfer structure 100 may be transferred onto another substrate having a large area.

The metal layer 124 may include Ag, Au, Pt, Ni, Cr, and/or Al, and may have a different surface energy from that of the base layer 110. The difference in surface energy not only allows the micro LEDs 130 to be well transferred into the holes H, but also allows the micro LEDs 130 remaining without being transferred into the holes H to be well separated from the display transfer structure 100 in the process of cleaning. The metal layer 124 may be selected from a hydrophobic material (e.g., a second material), and the base layer 110 in the holes H may be selected from a hydrophilic material (e.g., a first material), so that the two may have a large surface energy difference.

The micro LEDs 130 may be positioned respectively in the holes H. The micro LEDs 130 may include an inorganic light emitting material having a size of 100 μm or less in width, length, and height, and may emit light by themselves when power is supplied thereto.

Each of the micro LEDs 130 according to an embodiment may include an n-type semiconductor layer, an active layer, and a p-type semiconductor layer. The n-type semiconductor layer may be an n-type GaN layer, the p-type semiconductor layer may be a p-type GaN layer, and the active layer may have a quantum well structure or a multi-quantum well structure.

The micro LEDs 130 according to an embodiment may have a horizontal electrode structure in which a negative electrode and a positive electrode are provided on one side. As shown in FIG. 1, the micro LEDs 130 may include a first surface 131 and a second surface 132 opposite thereto, and a first electrode 133 and a second electrode 134 spaced apart from each other may be positioned on the first surface 131. The first and second electrodes 133 and 134 may be formed of metals such as Al, Au, Pt, Mo, Cu, Ag, and/or Zn, and the first electrode 133 may be a positive electrode, and the second electrode 134 may be a negative electrode. The first surface 131 of the micro LEDs 130 may have hydrophobicity due to the electrodes including metals, whereas the second surface 132 of the micros LEDs 130 may have hydrophilicity due to semiconductor materials.

FIGS. 2A to 2D are reference views describing a method of manufacturing the display transfer structure 100 of FIG. 1 according to an embodiment.

Figure 2A:
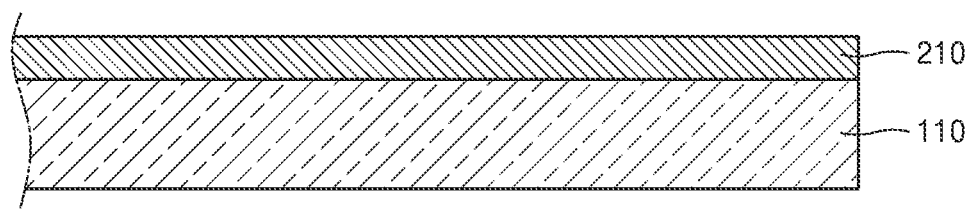
FIGS. 2A to 2D are reference views describing a method of manufacturing the display transfer structure of FIG. 1 according to an embodiment.

As shown in FIG. 2A, a polymer layer 210 may be formed on the base layer 110. The polymer layer 210 may be formed of a photosensitive polymer.

Figure 2B:
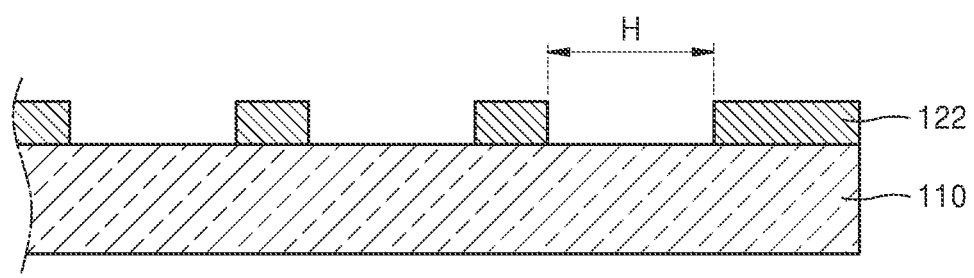

As shown in FIG. 2B, the polymer layer 122 having holes may be manufactured by forming the holes H using a photolithography process. The forming of the holes H using a laser may more accurately control the size of the holes H, and may reduce the tolerance in the forming of the holes H. However, the forming of the holes H is not limited thereto. The holes H may be formed through etching or molding.

Figure 2C:
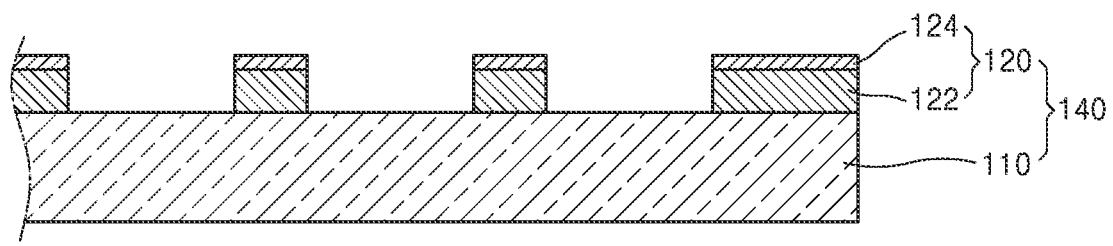

As shown in FIG. 2C, the flexible barrier rib 120 may be completed by forming the metal layer 124 on an upper surface of the polymer layer 122. The display transfer structure without the micro LEDs 130 as shown in FIG. 2C may be referred to as a transfer substrate 140.

Figure 2D:
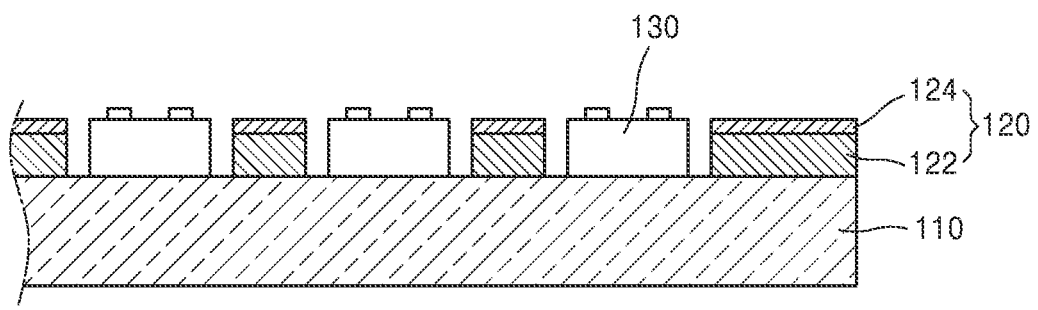

As shown in FIG. 2D, the micro LEDs 130 may be transferred into the holes H. As a transfer method, a wet alignment method may be used. The micro LEDs 130 will be described in detail later.

Figure 3A:
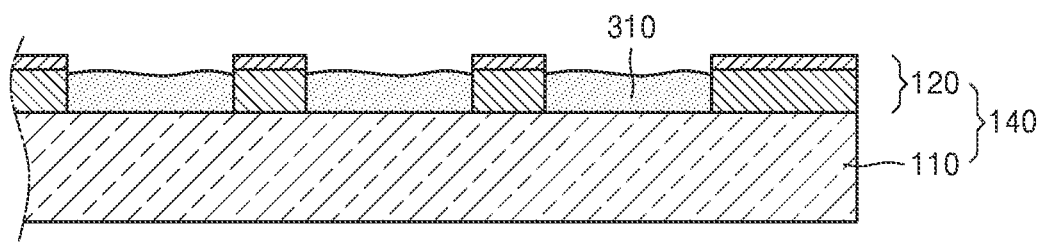
FIGS. 3A to 3C are reference views describing a method of transferring micro LEDs on a transfer substrate according to an embodiment.
Figure 3B:
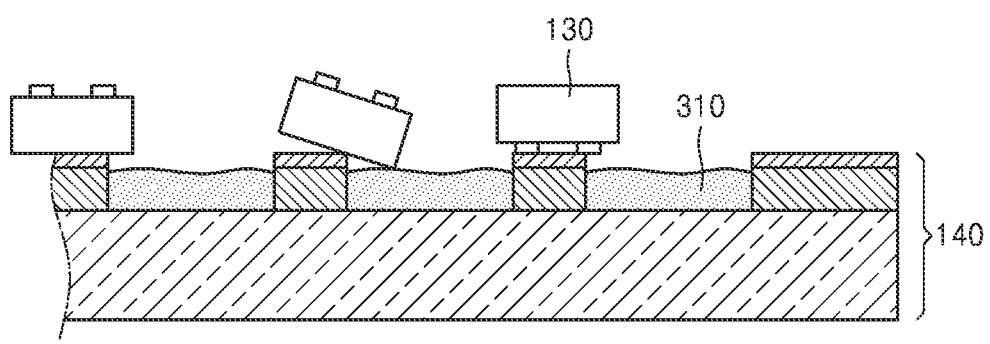
Figure 3C:
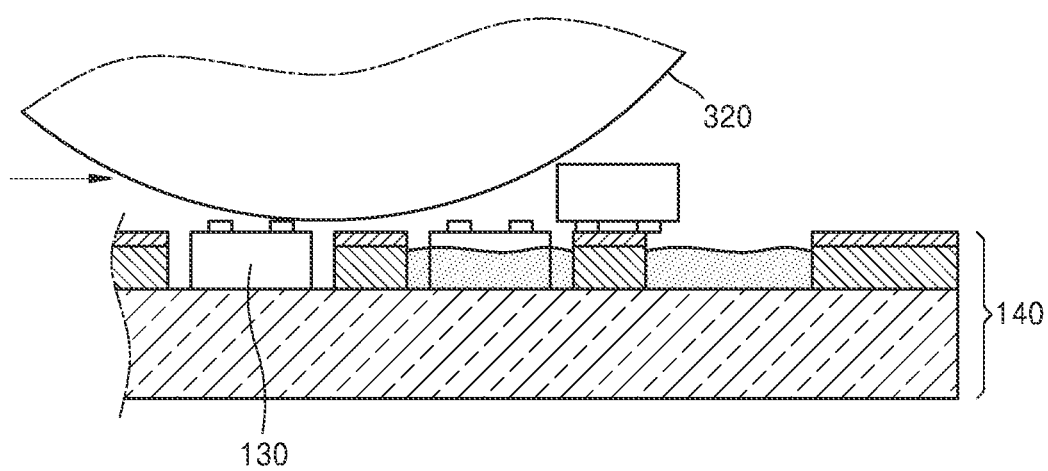

FIGS. 3A to 3C are reference views describing a method of transferring micro LEDs onto a transfer substrate 140 according to an embodiment.

As shown in FIG. 3A, liquid 310 may be supplied to the transfer substrate 140. As for the liquid 310, any type of liquid may be used unless the liquid corrodes or damages the micro LEDs 130. The liquid 310, for example, may include one from the group containing water, ethanol, alcohol, polyol, ketone, halocarbon, acetone, flux, and organic solvent, or a combination thereof. The organic solvent may include, for example, isopropyl alcohol (IPA). The liquid 310, which may be used, is not limited thereto, and various other ones may be used.

As a method of supplying the liquid 310 to the transfer substrate 140, various methods such as a spray method, a dispensing method, an inkjet dot method, and a method of flowing the liquid 310 to the transfer substrate 140 may be used. Descriptions thereof will be illustrated later. Meanwhile, the amount of the liquid 310 may be variously controlled to be suitable for the holes H or to overflow from the holes H.

As shown in FIG. 3B, a plurality of micro LEDs 130 may be supplied to the transfer substrate 140. The micro LEDs 130 may be directly sprayed on the transfer substrate 140 without the liquid 310 or may be supplied in a state of being included in a suspension. As a method of supplying the micro LEDs 130 included in the suspension, methods such as a spray method, a dispensing method of dropping the liquid 310 dropwise, an inkjet dot method of discharging liquid like a printing method, and a method of flowing the suspension onto the transfer substrate 140 may be used.

As shown in FIG. 3C, the transfer substrate 140 is scanned with an absorber 320 capable of absorbing the liquid 310. The absorber 320 is usable as long as the material is capable of absorbing the liquid 310, and the shape or the structure thereof is not limited. The absorber 320 may include, for example, fabric, tissue, polyester fiber, paper, or wiper. The absorber 320 may be used alone without other auxiliary devices, but is not limited thereto, and may be combined with a support for the purpose of convenient scanning of the transfer substrate 140. The support may have various shapes and structures suitable for scanning the transfer substrate 140. The support may have the form of, for example, a rod, a blade, a plate, or a wiper. The absorber 320 may be provided on one side of the support, or may surround the support.

The absorber 320 may scan the transfer substrate 140 by applying an appropriate pressure. The transfer substrate 140 according to an embodiment includes the flexible barrier rib 120, and may thus be restored to an original thickness thereof after scanning even when the appropriate pressure is applied. Accordingly, the display transfer structure 100 may keep a certain shape unchanged. This serves as a help when a display device is manufactured using the display transfer structure 100 or when the micro LEDs 130 are transferred onto another substrate.

The scanning may include absorbing the liquid 310 as the absorber 320 contacts the transfer substrate 140 and passes through the plurality of holes H. The scanning may be performed through methods such as a sliding method, a rotating method, a translational motion method, a reciprocating motion method, a rolling method, a spinning method, and/or a rubbing method, and may be performed in both a regular manner and an irregular manner.

The scanning may be performed by moving the transfer substrate 140 instead of moving the absorber 320, and the scanning of the transfer substrate 140 may also be performed through sliding, rotating, translational reciprocating, rolling, spinning, and/or rubbing. Of course, the scanning may be performed through cooperation of the absorber 320 and the transfer substrate 140.

The supplying of the liquid 310 to the holes H of the transfer substrate 140 and the supplying of the micro LEDs 130 to the transfer substrate 140 may be performed in the reverse order of those described in FIGS. 3A and 3B. In addition, the supplying of the liquid 310 to the holes H of the transfer substrate 140 and the supplying of the micro LEDs 130 to the transfer substrate 140 may be concurrently performed. For example, by supplying a suspension including the micro LEDs 130 to the transfer substrate 140, both the liquid 310 and the micro LEDs 130 may be supplied together to the transfer substrate 140.

The absorber 320 scans the transfer substrate 140, and then the dummy micro LEDs remaining on the transfer substrate 140 without entering the holes H may be removed. FIGS. 3A to 3C may be repeated, and through these processes, the micro LEDs 130 may be swiftly transferred on the transfer substrate 140.

Figure 4A:
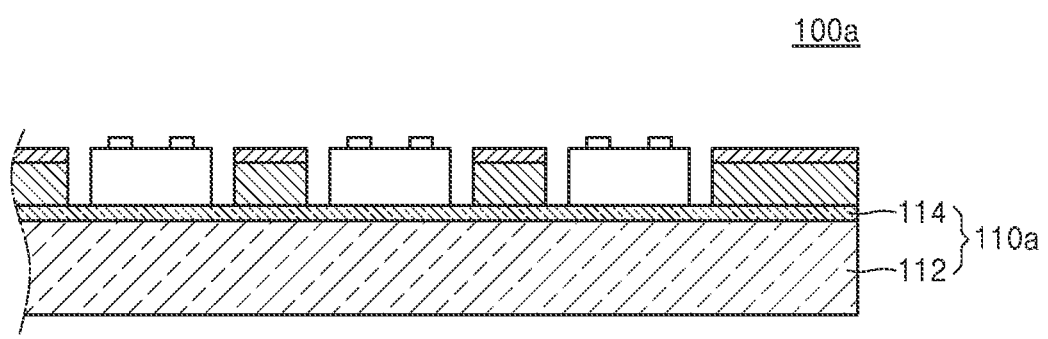
FIG. 4A is a view showing a display transfer structure including a flexible film according to an embodiment.

The base layer 110 may further include a flexible film to increase the flexibility of the display transfer structure 100. FIG. 4A is a view showing a display transfer structure 100a including a flexible film according to an embodiment. When comparing FIG. 1 and FIG. 4A, a base layer 110a may include a substrate 112 and a flexible film 114 between the substrate 112 and the flexible barrier rib 120. The flexible film 114 may also include a polymer, but may be formed of a material different from that of the polymer layer 122. For example, the flexible film 114 may be formed of a non-photosensitive polymer. For example, the flexible film 114 may include at least one of polyimide (PI), polycarbonate (PC), polyethylene terephthalate (PET), tri-acetyl cellulose (TAC), and covalent organic polymer (COP). Accordingly, when the flexible barrier rib 120 is manufactured, the flexible film 114 may be prevented from being etched by light.

Figure 4B:
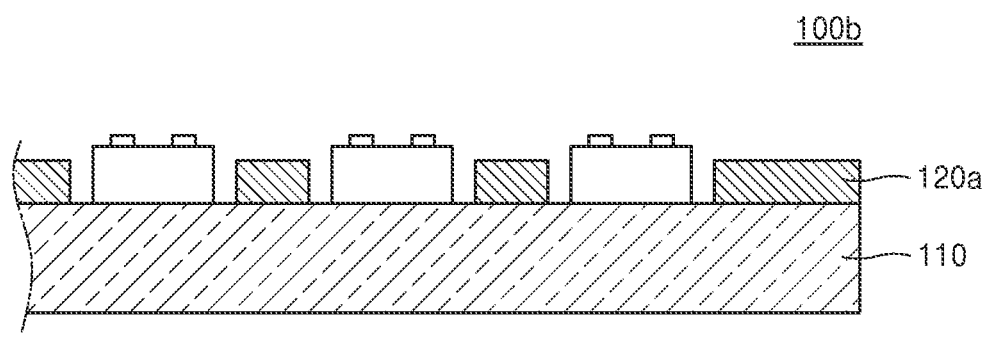
FIG. 4B is a view showing a display transfer structure according to an embodiment.

FIG. 4B is a view showing a display transfer structure 100b according to an embodiment. When comparing FIG. 1 and FIG. 4B, a flexible barrier rib 120a may be formed of a polymer material alone. When an upper surface of the polymer material is more hydrophobic than an upper surface of the base layer 110, the flexible barrier rib 120a is not required to include a metal layer. Alternatively, the upper surface of the flexible barrier rib 120a may be surface-treated with a hydrophobic material.

A display may be manufactured by transferring the micro LEDs 130 included in the display transfer structure 100 according to an embodiment.

FIGS. 5A to 5E are reference views describing a process for manufacturing a display device, using the display transfer structure 100 of FIG. 1.

Figure 5A:
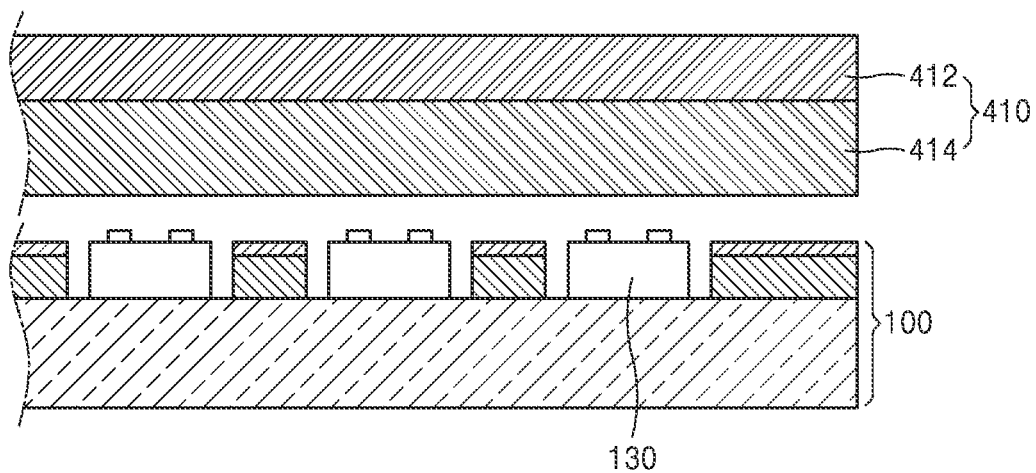
FIGS. 5A to 5E are reference views describing a process for manufacturing a display device, using the display transfer structure of FIG. 1.

Referring to FIG. 5A, a target substrate 410 may be aligned on the display transfer structure 100 of FIG. 1. The target substrate 410 may include a substrate 412 and a driving layer 414. The substrate 412 may include an insulating material such as glass, organic polymer, and quartz. In addition, the substrate 412 may be made of a flexible material that may be bent or folded, and may have a single-layer structure or a multi-layer structure. The driving layer 414 may include a transistor, an electrode pattern, etc. for driving the micro LEDs 130. The electrodes of the micro LEDs 130 may be positioned to face the electrode pattern formed on the target substrate 410.

An align key may be used to align the display transfer structure 100 with the target substrate 410. The align key may be positioned on at least one of the display transfer structure 100 and the target substrate 410.

Figure 5B:
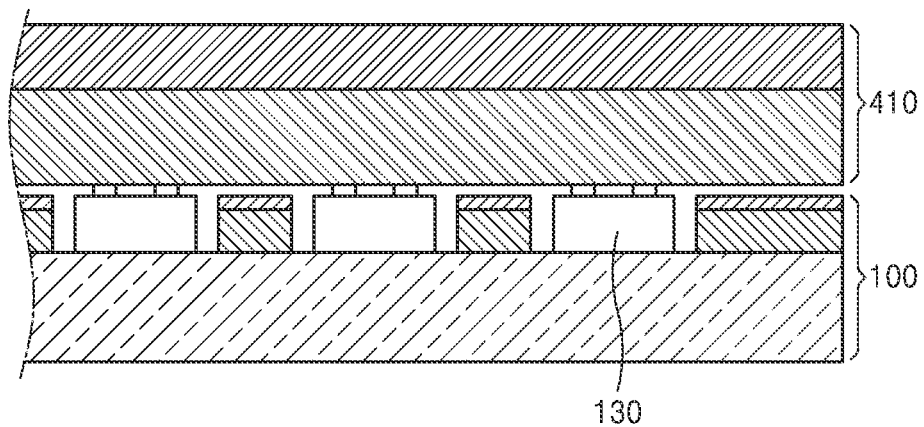

As shown in FIG. 5B, the micro LEDs 130 of the display transfer structure 100 may be transferred onto the target substrate 410. For example, the micro LEDs 130 may be transferred onto the target substrate 410 through a bonding method. The display transfer structure 100 is aligned with the target substrate 410, and then heat is applied thereto using thermal compression, ultrasound, or light (laser, UV) to bond the micro LEDs 130 to the target substrate 410. For example, when thermal compression is applied to the electrodes positioned to face each other on the micro LEDs 130 and the target substrate 410, the micro LEDs 130 are bonded to a driving substrate while being compressed in proportion to pressure and temperature. In the thermal compression process, the metal of the micro LEDs 130 may be bonded to the metal of the driving layer 414.

Figure 5C:
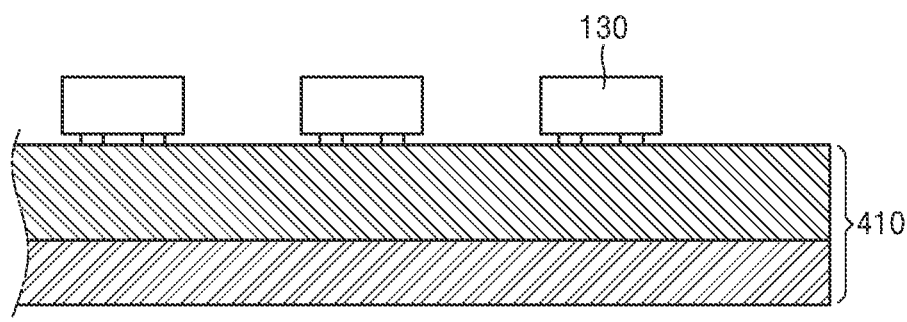

The micro LEDs 130 are transferred onto the target substrate 410, and then the transfer substrate 140 is removed. Then, as shown in FIG. 5C, the position of the target substrate 410 is changed such that the micro LEDs 130 are positioned above the target substrate 410.

Figure 5D:
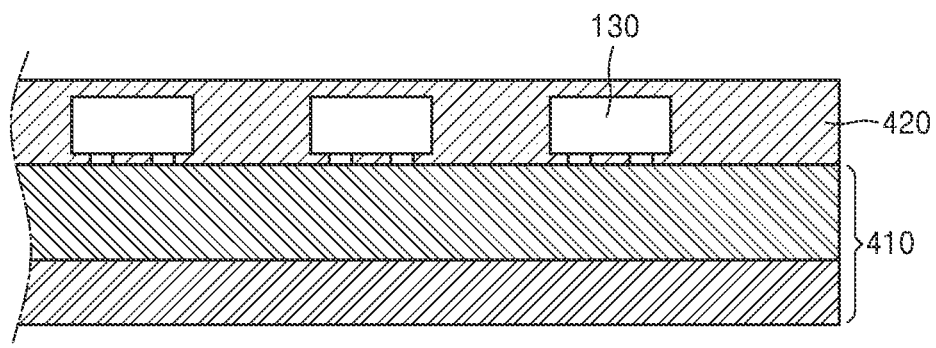

As shown in FIG. 5D, a planarization layer 420 may be formed on the micro LEDs 130. The planarization layer 420 may have a flat top surface and cover the micro LEDs 130. The planarization layer 420 may reduce a step difference generated by the components positioned below the planarization layer 420, and may prevent oxygen and moisture from penetrating into the micro LEDs 130. The planarization layer 420 may be formed of an insulating material. The planarization layer 420 may include an organic insulating layer (acrylic or silicone-based polymer) or an inorganic insulating layer ($SiO_2$, SiN, $Al_2O_3$, or $TiO_2$). The planarization layer 420 may be formed in a multi-layered structure including a plurality of insulating materials having different dielectric constants.

Figure 5E:
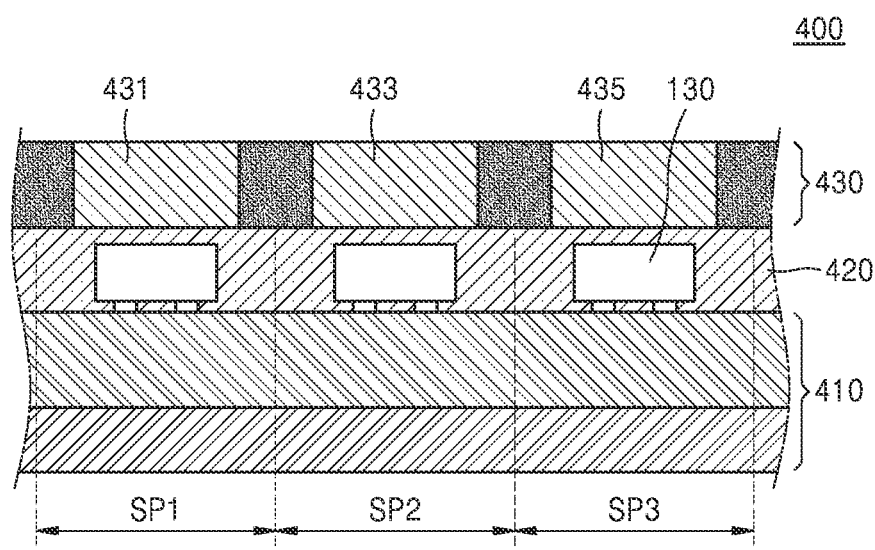

As shown in FIG. 5E, a color conversion layer 430 may be formed on the planarization layer 420. When the micro LEDs 130 emit light of the same wavelength, the color conversion layer 430 may include first to third color conversion patterns 431, 433, and 435 converting light generated from the micro LEDs 130 into light having a predetermined wavelength. In this case, each of the first to third color conversion patterns 431, 433, and 435 may correspond to each sub-pixel. For example, the first color conversion pattern 431 may correspond to a first sub-pixel SP1, the second color conversion pattern 433 may correspond to a second sub-pixel SP2, and the third color conversion pattern 434 may correspond to a third sub-pixel SP3. The color conversion layer 430 may be formed through a photolithography method.

Figure 6:
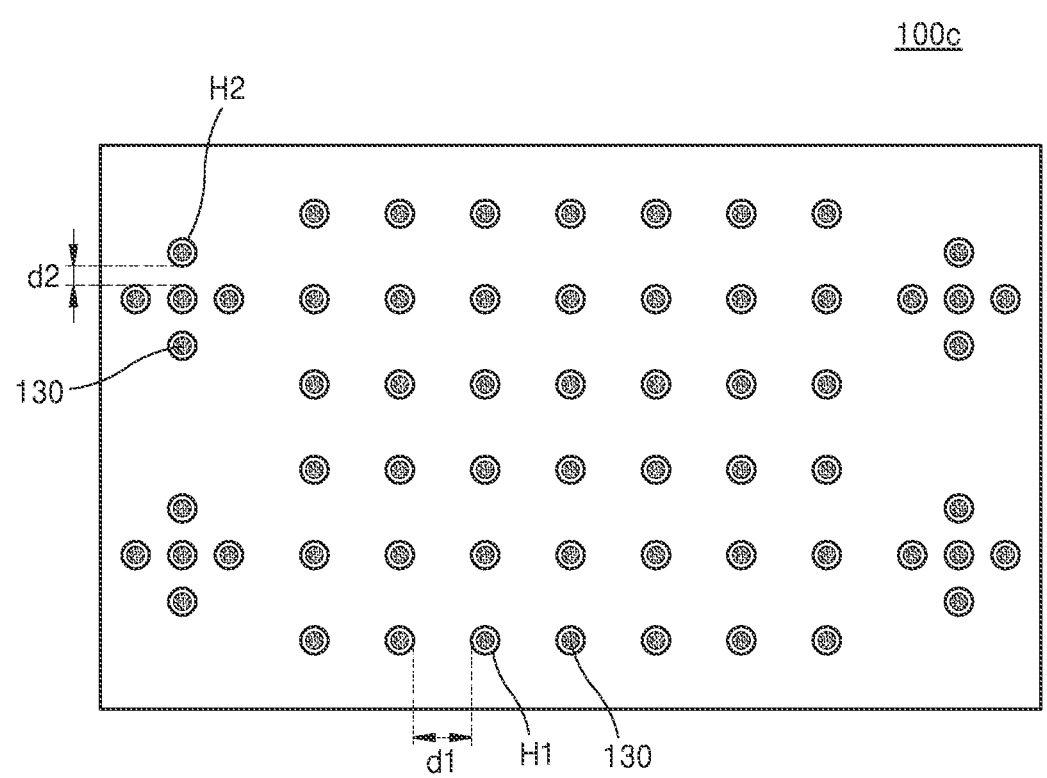
FIG. 6 is a view showing a display transfer structure including an align key according to an embodiment.

When aligning the display transfer structure with the target substrate, patterns of micro LEDs or holes included in the display transfer structure may be used as an align key. FIG. 6 is a view showing a display transfer structure 100c including an align key according to an embodiment. As shown in FIG. 6, the display transfer structure 100c may include first holes H1 and second holes H2 arranged at different intervals. For example, the first holes H1 may be arranged at a first interval d1, and the second holes H2 may be arranged at a second interval d2, the second interval d2 being different from the first interval d1. The second holes H2 may be arranged at a shorter interval than the first holes H1. The first holes H1 may be arranged in a central region of the display transfer structure 100c, and the second holes H2 may be arranged in an edge region of the display transfer structure 100c.

The micro LEDs 130 respectively arranged in the first holes H1 may be transferred onto the target substrate, and the second holes H2, the micro LEDs 130 arranged in the second holes H2, or the electrodes of the micro LEDs arranged in the second holes H2 may be used as an align key.

In FIG. 6, the micro LEDs 130 subjected to transfer and the micro LEDs 130 used as an align key are differentiated based on the intervals between the first and second holes H1 and H2, but the embodiment is not limited thereto. By varying the size of the first and second holes H1 and H2 or the shape of the first and second holes H1 and H2, the micro LEDs 130 subjected to transfer may be differentiated from the micro LEDs 130 used as an align key.

It is stated that the micro LEDs 130 are transferred onto the target substrate including a driving layer by using the display transfer structure, but the embodiment is not limited thereto. When the display transfer structure includes the driving layer, the display transfer structure itself may serve as a component of a display device.

FIGS. 7A to 7E are reference views describing a process for manufacturing a display device, using a display transfer structure.

Figure 7A:
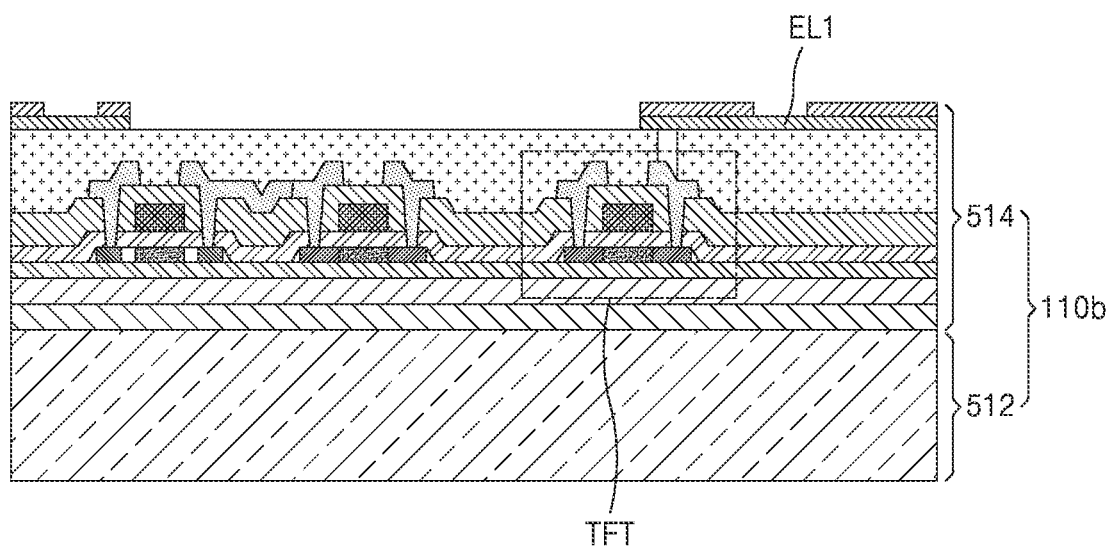
FIGS. 7A to 7E are reference views describing a process for manufacturing a display device, using a display transfer structure.

As shown in FIG. 7A, a base layer 110b may be formed by forming a driving layer 514 on a substrate 512. The driving layer 514 may include a TFT, a first electrode pattern EL1, and a capacitor.

Figure 7B:
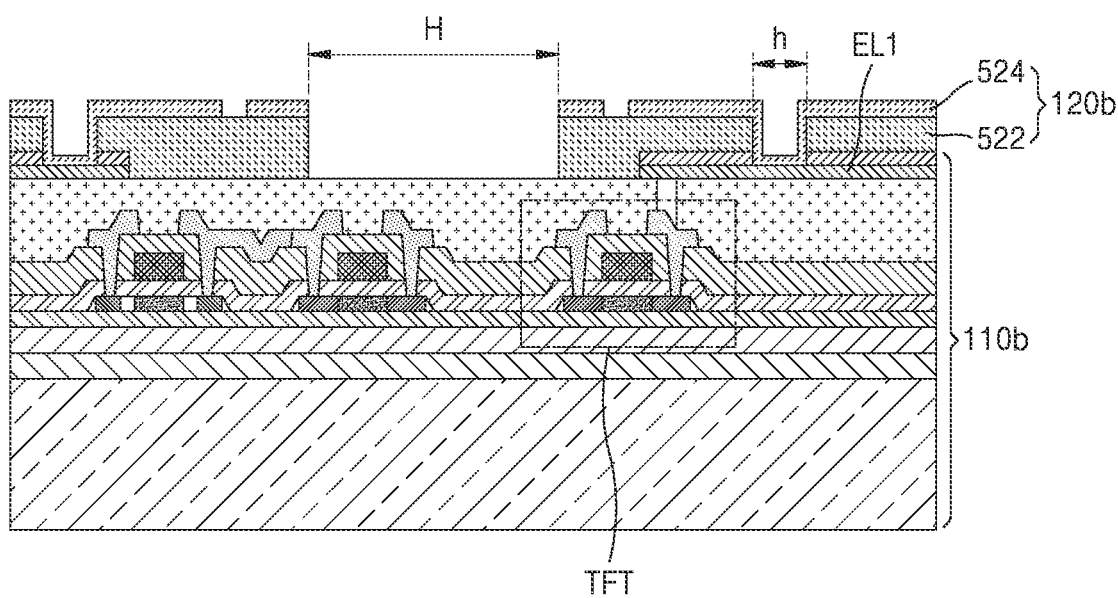

As shown in FIG. 7B, a flexible barrier rib 120b having holes H may be formed on the base layer 110b. The flexible barrier rib 120b may include a polymer layer 522 and a metal layer 524. The metal layer 524 may be electrically connected to the first electrode pattern EL1 of the base layer 110 through a through hole h formed in the polymer layer 522.

Figure 7C:
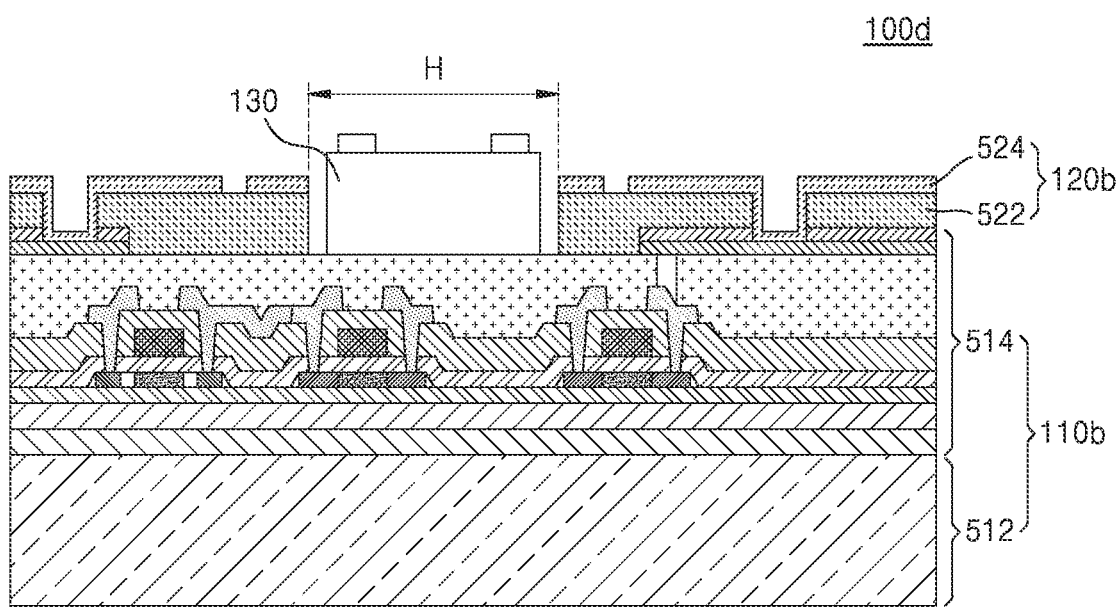

As shown in FIG. 7C, the micro LEDs 130 may be transferred into the holes H. The transfer of the micro LEDs 130 has been described above, and thus, a detailed description thereof will be omitted.

Figure 7D:
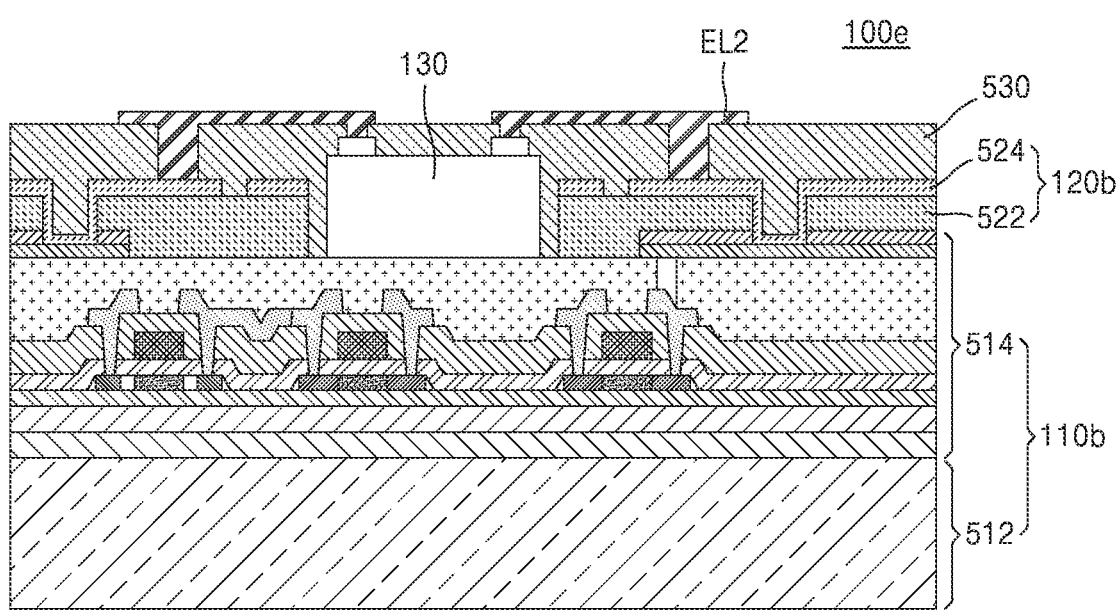

As shown in FIG. 7D, an insulating layer 530 covering at least a portion of the micro LEDs 130 and the flexible barrier rib 120b is formed, and a second electrode pattern EL2 electrically connecting the micro LEDs 130 and the driving layer 514 may be formed. The second electrode pattern EL2 may be electrically connected to the first electrode pattern EL1 of the driving layer 514 through the metal layer 524 of the flexible barrier rib 120b. The insulating layer 530 may prevent oxygen and moisture from penetrating into the micro LEDs 130.

Figure 7E:
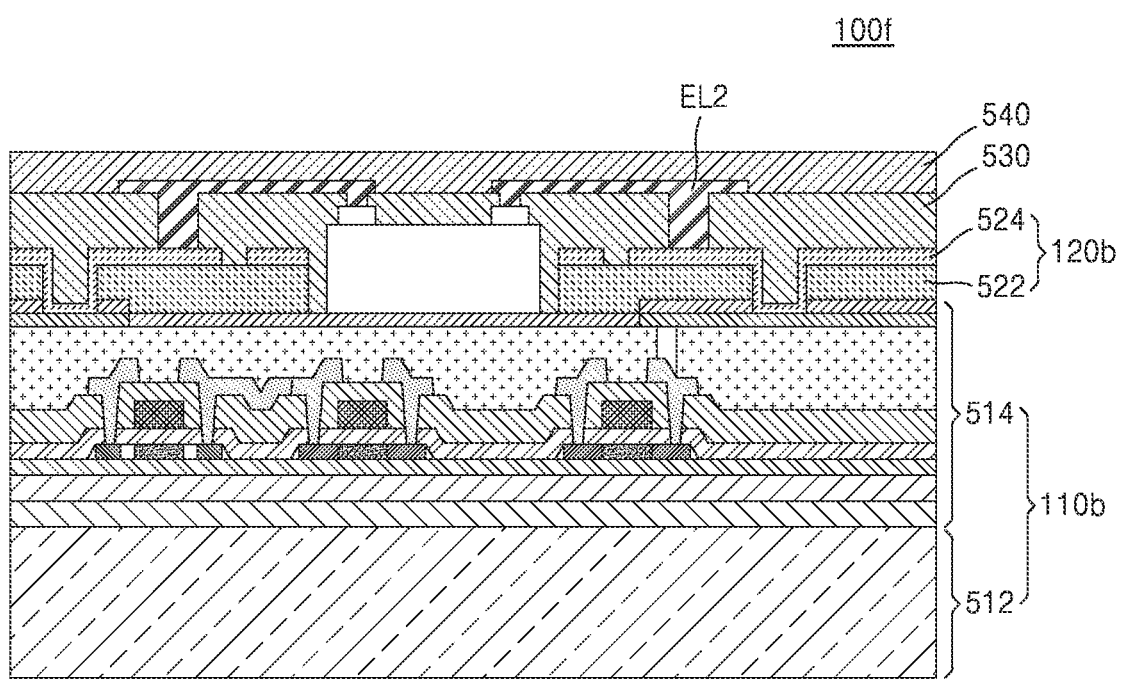

Then, as shown in FIG. 7E, a planarization layer 540 may be formed on the insulating layer 530 and the second electrode pattern EL2. Thereafter, a color conversion layer may be further formed as well. Each of structures 100d, 100e, and 100f shown in FIGS. 7C to 7E may be referred to as a display transfer structure. That is, the structures 100d, 100e, and 100f including the base layer 110b, the flexible barrier rib 120b, and the micro LEDs 130 may all be display transfer structures.

A display device may be manufactured by stacking components of a display device on the display transfer structure without transferring the micro LEDs included in the display transfer structure onto a separate device. Thus, a decrease in yield due to the transfer process may be reduced.

Figure 8:
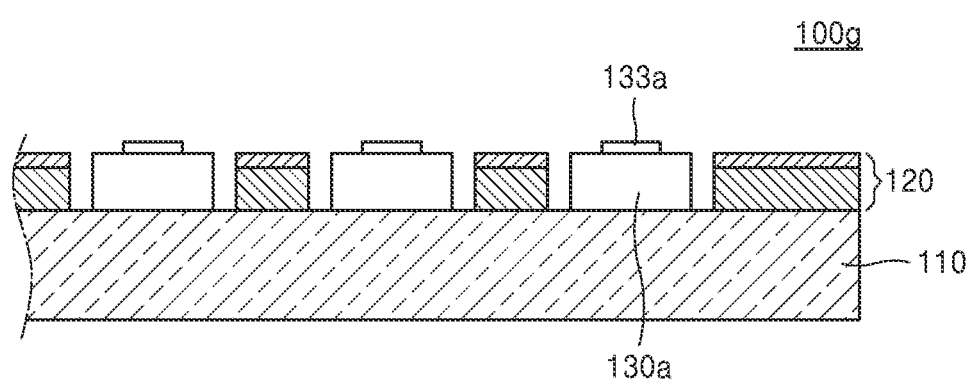
FIG. 8 is a view showing a display transfer structure according to an embodiment.

FIG. 8 is a view showing a display transfer structure 100g according to an embodiment. Comparing FIG. 1 to FIG. 8, one electrode 133a may be positioned on one surface of each of the micro LEDs 130a included in the display transfer structure 100g of FIG. 8. The display device may be formed when the micro LEDs 130a including the electrode 133a alone having one characteristic of FIG. 8 are transferred. The display transfer structure 100g of FIG. 8 may be used to manufacture a display device including vertical micro LEDs.

Figure 9:
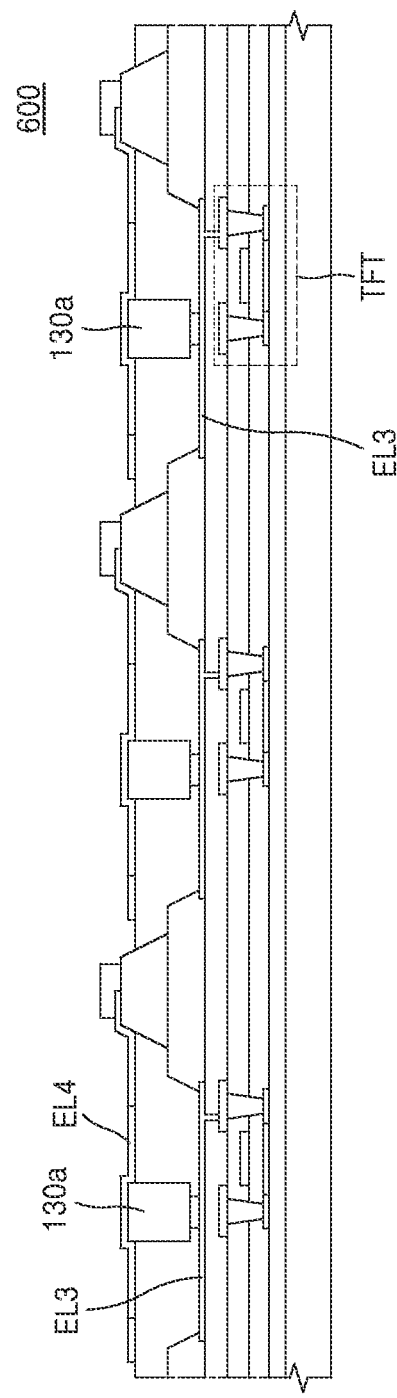
FIG. 9 is a view showing a display device manufactured using the display transfer structure of FIG. 8.

FIG. 9 is a view showing a display device manufactured using the display transfer structure 100g of FIG. 8. Comparing FIG. 7 to FIG. 9, a display device 600 of FIG. 9 may include an electrode pattern EL3 positioned below the micro LEDs 130 and an electrode pattern EL4 positioned above the micro LEDs 130a. That is, the micro LEDs 130a may be vertical.

The display transfer structure according to an embodiment may be adopted for various electronic devices. For example, the electronic devices may be applied to a TV set, a laptop computer, a mobile phone, a smart phone, a smart pad (PD), a portable media player (PMP), a personal digital assistant (PDA), a navigation system, and various wearable devices such as a smart watch.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display transfer structure comprising:
   a base layer;
   a flexible barrier rib positioned on the base layer, the flexible barrier rib having a plurality of holes; and
   a plurality of micro light emitting diodes (LEDs) respectively positioned in the plurality of holes,
   wherein each of the plurality of micro LEDs comprises a surface facing an outside of the plurality of holes, and
   wherein for each of the plurality of micro LEDs, at least one electrode is positioned on the surface,
   wherein the flexible barrier rib comprises:
   a polymer layer positioned on the base layer; and
   a metal layer positioned on the polymer layer and spatially spaced apart from each of the at least one electrode of each of the plurality of electrodes, and the metal layer includes discontinuities to expose side surfaces at the discontinuities within the plurality of holes, and
   wherein the metal layer does not overlap with the plurality of micro LEDs that respectively contacts the base layer within the plurality of holes in the thickness direction of the base layer,
   wherein a height of an upper surface of the at least one electrode is greater than that of an upper surface of the metal layer for each of the plurality of micro LEDs to be transferred to a target substrate.

2. The display transfer structure of claim 1,
   wherein each of the plurality of holes has a cross-section larger than a cross-section of the respective micro LED, and smaller than twice the cross-section of the respective micro LED.

3. The display transfer structure of claim 1,
   wherein the flexible barrier rib has a depth that is 0.8 times to 1.5 times a largest thickness of the plurality of micro LEDs.

4. The display transfer structure of claim 1,
   wherein the base layer comprises a first material and the flexible barrier rib comprises a second material different from the first material.

5. The display transfer structure of claim 1,
   wherein the flexible barrier rib comprises a polymer material.

6. The display transfer structure of claim 5,
   wherein the polymer material comprises a photosensitive material.

7. The display transfer structure of claim 1,
wherein the polymer layer comprises at least one from among an acrylic-based polymer, a silicone-based polymer, and an epoxy-based polymer.
8. The display transfer structure of claim 1,
wherein the metal layer comprises at least one from among Ag, Au, Pt, Ni, Cr, and Al.
9. The display transfer structure of claim 1,
wherein the base layer comprises:
   a substrate; and
   a flexible film between the substrate and the flexible barrier rib.
10. The display transfer structure of claim 9,
wherein the flexible film comprises at least one of polyimide (PI), polycarbonate (PC), polyethylene terephthalate (PET), tri-acetyl cellulose (TAC), and covalent organic polymer (COP).
11. The display transfer structure of claim 1,
wherein the plurality of holes comprises a plurality of first holes arranged at a first interval and a plurality of second holes arranged at a second interval, the second interval being different from the first interval.
12. The display transfer structure of claim 11,
wherein the plurality of first holes is positioned in a central region of the display transfer structure, and
wherein the plurality of second holes is positioned in an edge region of the display transfer structure.

\* \* \* \* \*